United States Patent
Kasa et al.

[19]

[11] Patent Number: 6,163,478

[45] Date of Patent: Dec. 19, 2000

[54] COMMON FLASH INTERFACE IMPLEMENTATION FOR A SIMULTANEOUS OPERATION FLASH MEMORY DEVICE

[75] Inventors: Yasushi Kasa, Kawasaki, Japan; Fan W. Lai, Sunnyvale, Calif.

[73] Assignees: Advanced Micro Devices, Inc., Sunnyvale, Calif.; Fujitsu, Ltd., Japan

[21] Appl. No.: 09/421,774

[22] Filed: Oct. 19, 1999

[51] Int. Cl.[7] .................................................. G11C 16/04
[52] U.S. Cl. ................................ 365/185.01; 365/189.01; 365/230.06; 365/230.03; 365/185.33
[58] Field of Search .......................... 365/189.01, 230.01, 365/230.03, 230.08, 230.06, 185.01, 185.33

[56] References Cited

U.S. PATENT DOCUMENTS

| | | | |
|---|---|---|---|
| 5,263,000 | 11/1993 | Buskirk et al. | 365/226 |
| 5,291,446 | 3/1994 | Buskirk et al. | 365/189.09 |
| 5,612,921 | 3/1997 | Chang et al. | 365/226 |
| 5,708,387 | 1/1998 | Cleveland et al. | 327/536 |
| 5,748,528 | 5/1998 | Campardo et al. | 365/185.13 |
| 5,841,696 | 11/1998 | Chen et al. | 365/185.11 |
| 5,847,998 | 12/1998 | Van Buslark | 365/185.33 |
| 5,867,430 | 2/1999 | Chen et al. | 365/189.04 |
| 5,933,364 | 8/1999 | Aoyama et al. | 365/63 |
| 6,005,803 | 12/1999 | Kuo et al. | 365/185.11 |
| 6,016,270 | 1/2000 | Thummalapally et al. | 365/185.11 |
| 6,081,450 | 6/2000 | Nawaki | 365/185.11 |

OTHER PUBLICATIONS

Brian Dipert and Markus Levy "Designing with Flash Memory—The definitive guided to designing flash memory hardware and software for components and PCMCIA cards", Annabooks, ISBN 0–929392–17–5, Ch. 3, pp. 23–44.

AMD, Technology Background brochure, "3.0 Volt–only Page Mode Flash Memory Technology."

AMD, Technology Background brochure, "3.0 Volt–only Burst Mode Flash Memory Technology."

AMD, Technology Background brochure, "1.8 Volt–only Flash Memory Technology."

AMD, Technology Background brochure, "AMD DL160 and DL320 Series Flash: New Densities, New Features."

Intel Corporation, "Common Flash Memory Interface Specification", Release 1.1, May 30, 1997.

AMD, "Common Flash Memory Interface Publication 100—Vendor & Device ID Code Assignments", Jul. 25, 1996, vol. 96.1.

AMD "Am29DL162C/AM29DL163C 16 Megabit (2 M x8–Bit/1 M x16–Bit) CMOS 3.0 Volt–only, Simultaneous Operation Flash Memory", Publication 21533, Rev: C Amendment +2, Jul. 14, 1999.

Intel Corporation, "1.8 Volt Intel® Dual–Plane Flash Memory 28F320D18 (x16)", Product Review Datasheet, Order Number: 290672–002, Oct. 1999.

Macronix International Co., Ltd. "MXIC Advance Information MX29VW160T/B—16M–BIT [2M × 8–BIT/1M × 16–BIT] Simultaneous Read/Write Single 2.5V Operation Flash Memory", P/N:PM0567, Rev. 0.8, May 17, 1999.

ATMEL Corporation, "ATMEL® 16–megabit (1M x16/2M x8) 3–volt Only Flash Memory", Rev. 0925H–08/99.

STMicroelectronics, "M59DR032A, M59DR032B, 32Mbit (2Mb x16, Dual Bank, Page) Low Voltage Flash Memory", preliminary data, Oct. 1999, pp. 1–38.

(List continued on next page.)

*Primary Examiner*—Viet Q. Nguyen
*Attorney, Agent, or Firm*—Brinks Hofer Gilson & Lione

[57] ABSTRACT

An alterable Common Flash Interface ("CFI") is disclosed which includes a storage array which stores the CFI data. The storage array provides sub-circuits for encoding the CFI data. The sub-circuits comprise elements which can be altered by changing a single metal layer of the fabrication process.

20 Claims, 13 Drawing Sheets

OTHER PUBLICATIONS

"AMD—Flash Introduction", obtained at the internet address http://www.amd.com/products/nvd/overview/flash_intro.html, Apr. 14, 1999.

"AMD—Simultaneous Read/Write", obtained at the internet address http://www.amd.com/products/nvd/overview/simuintro.html, Jul. 12, 1999.

"AMD News Release #", obtained at the internet address http://www.amd.com/news/prodpr/9879.html, Jul. 12, 1999.

"Intel® 1.8 Volt Dual–Plane 32–Mbit Flash Memory (D18)", obtained at the internet address http://www.intel.com/design/flcomp/prodbref/298131.htm, Nov. 18, 1999.

U.S. Patent Application, Ser. No. 09/159,023, filed Sep. 23, 1998.

U.S. Patent Application, Ser. No. 09/159,142, filed Sep. 23, 1998.

U.S. Patent Application, Ser. No. 09/159,489, filed Sep. 23, 1998.

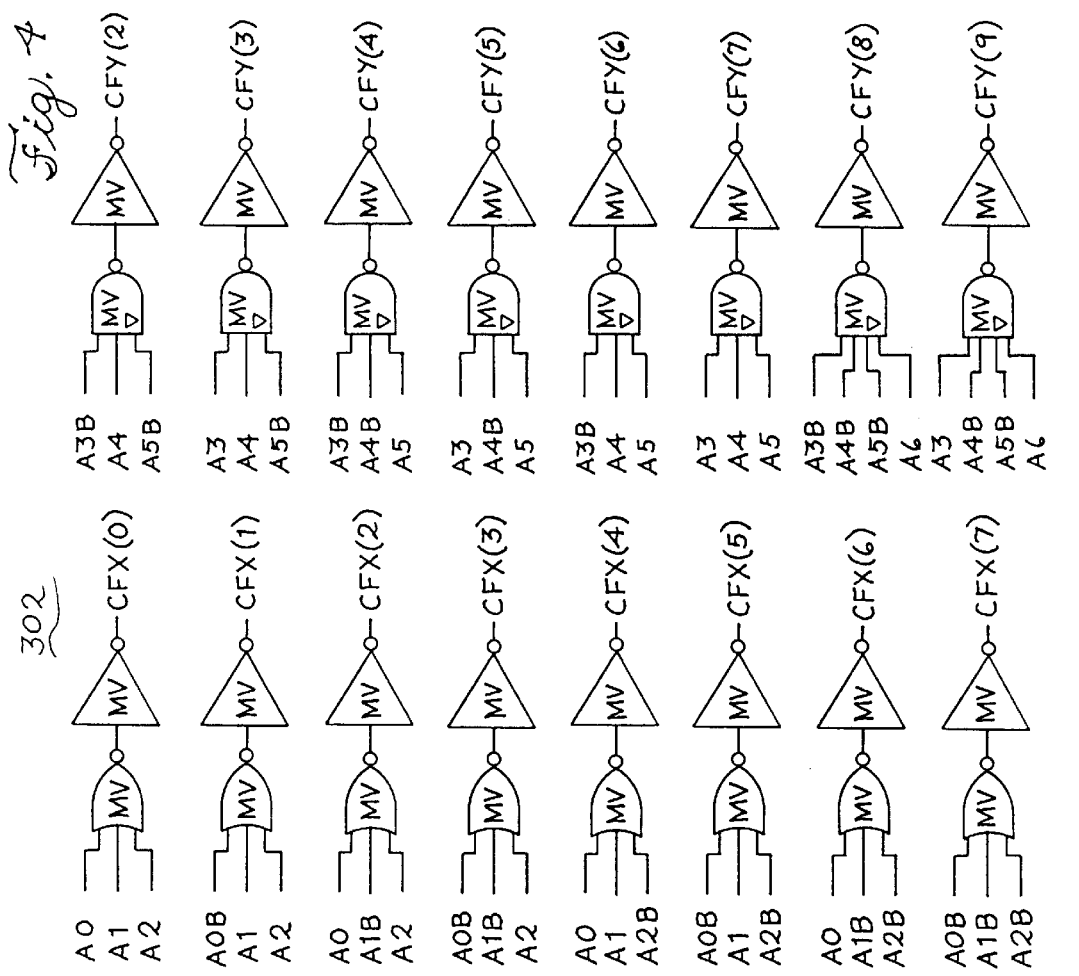
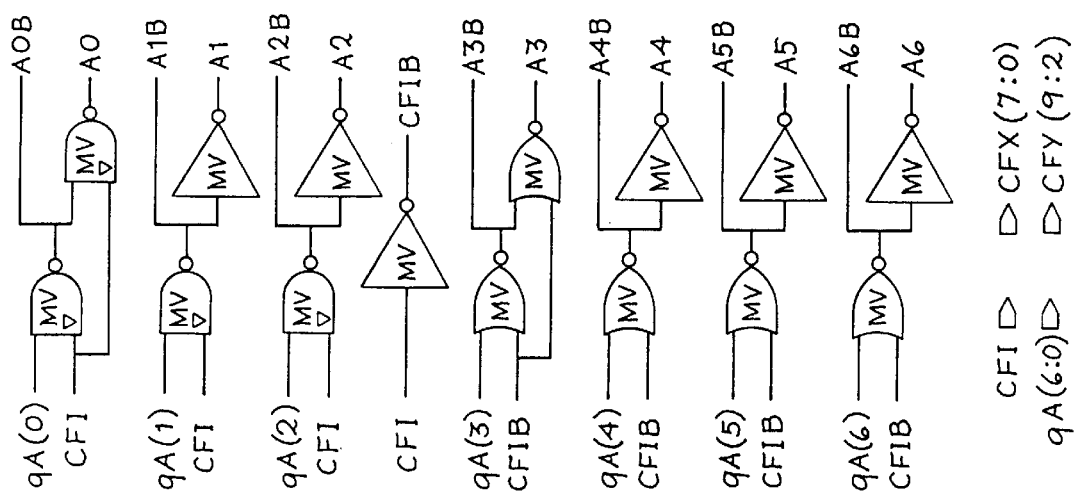
Fig. 4

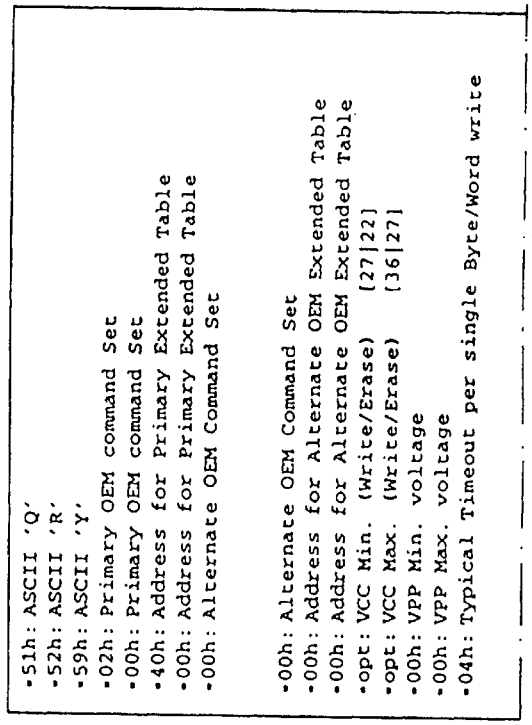
Fig. 6B(1)
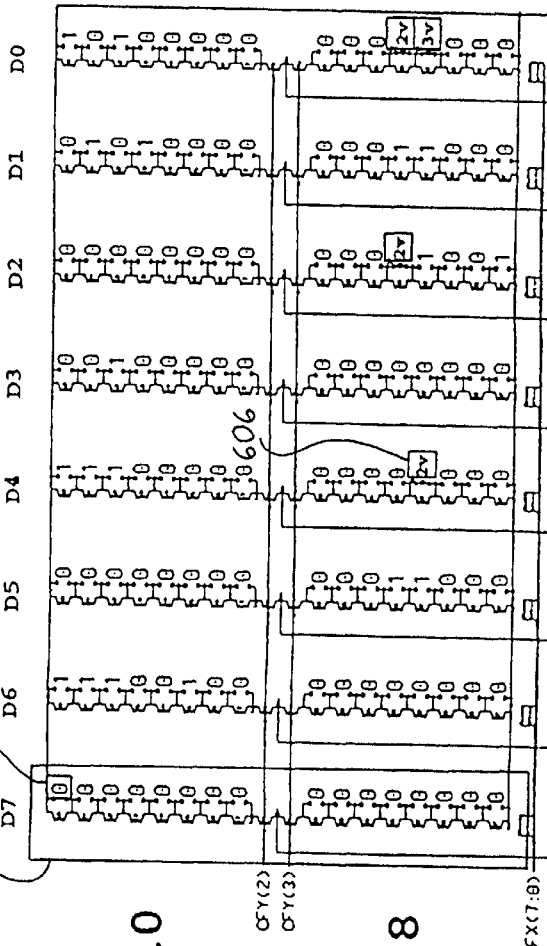
Fig. 6A(1)

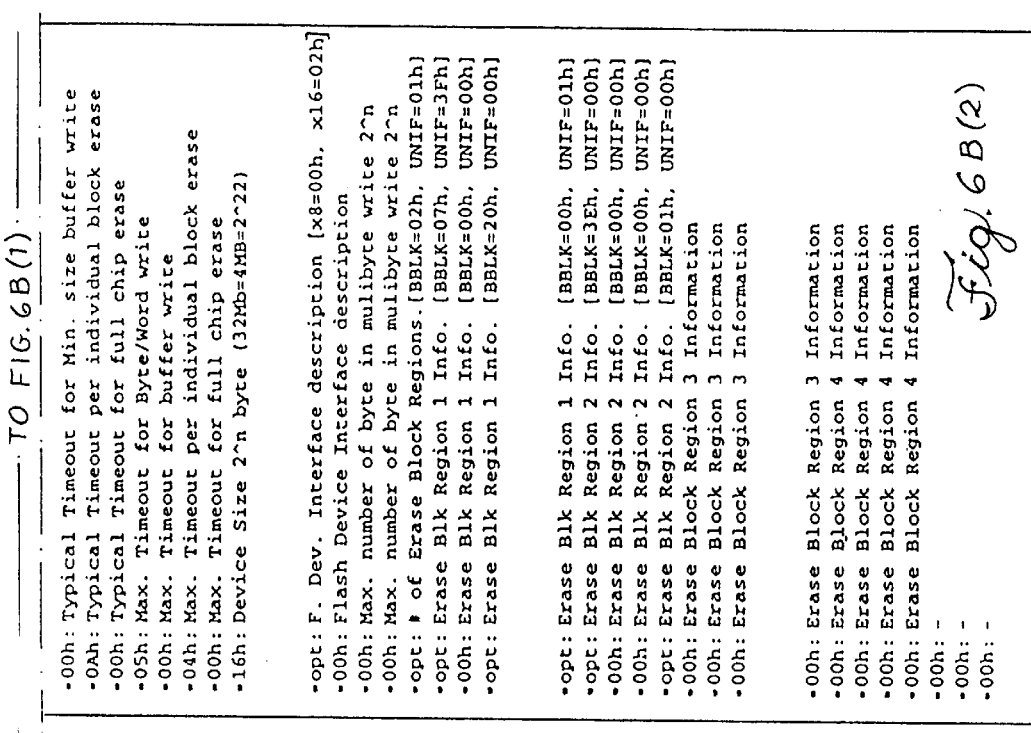
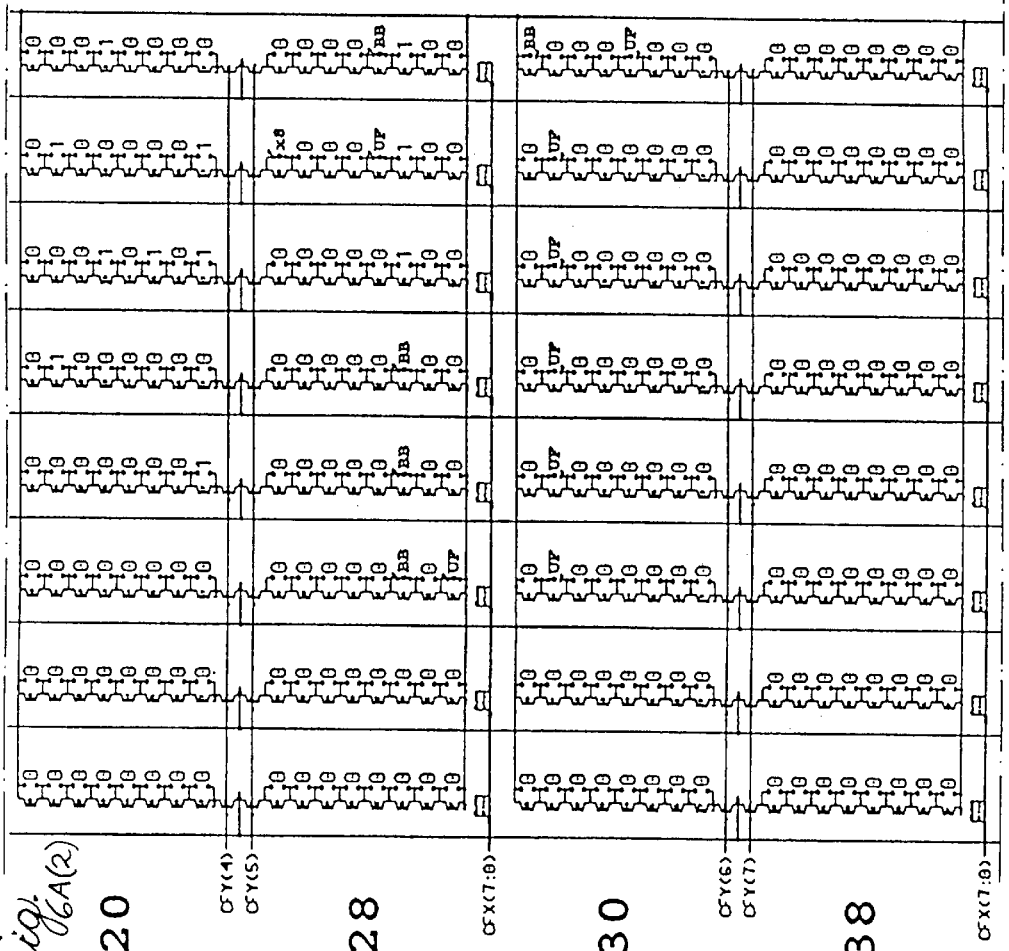
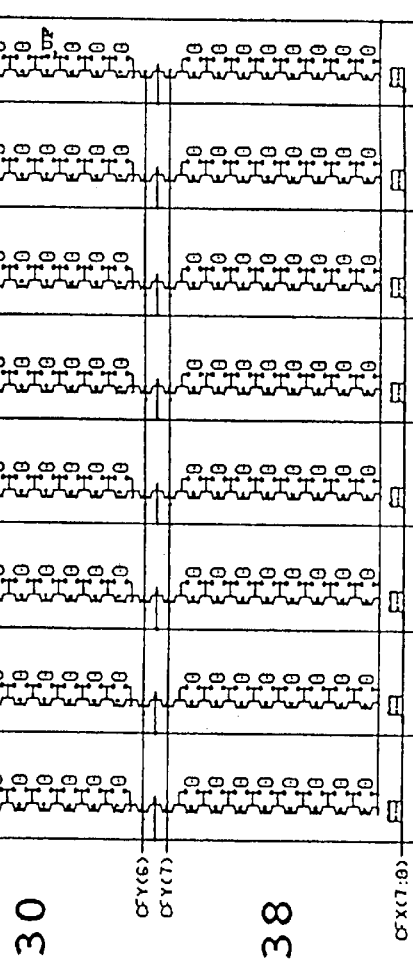

- 50h: ASCII 'P'
- 52h: ASCII 'R'
- 49h: ASCII 'I'
- 31h: Major version number, ASCII '1'
- 31h: Minor version number, ASCII '1'
- opt: Address Sensitive Unlock [BBLK=0, UNIF=1]
- 02h: Erase Suspend
- opt: Sector Protect #/group [BBLK=1, UNIF=4]

- 01h: Sector Temporary Unprotect
- 04h: Sector Protect/Unprotect scheme
- opt: SO Bank2 size [20h,30h,38h,3Fh] # of sectors.
- 00h: Burst Mode Type
- 00h: Page Mode Type
- 85h: ACC Min. voltage (8.5v)
- 95h: ACC Max. voltage (9.5v)
- opt: TOP/BOT Boot Block (Bot=2, Top=3, Unif=4)

*CODE CELL NAME

* 0: CF1 CODE0
* 1: CFI CODE1

* 2v: MOPT 2v
* 3v: MOPT 3v

* x8: MOPT x8
* x16: MOPT x16

- cfi_code : 0 = short, 1 = open
- cfi_nopt : metal option

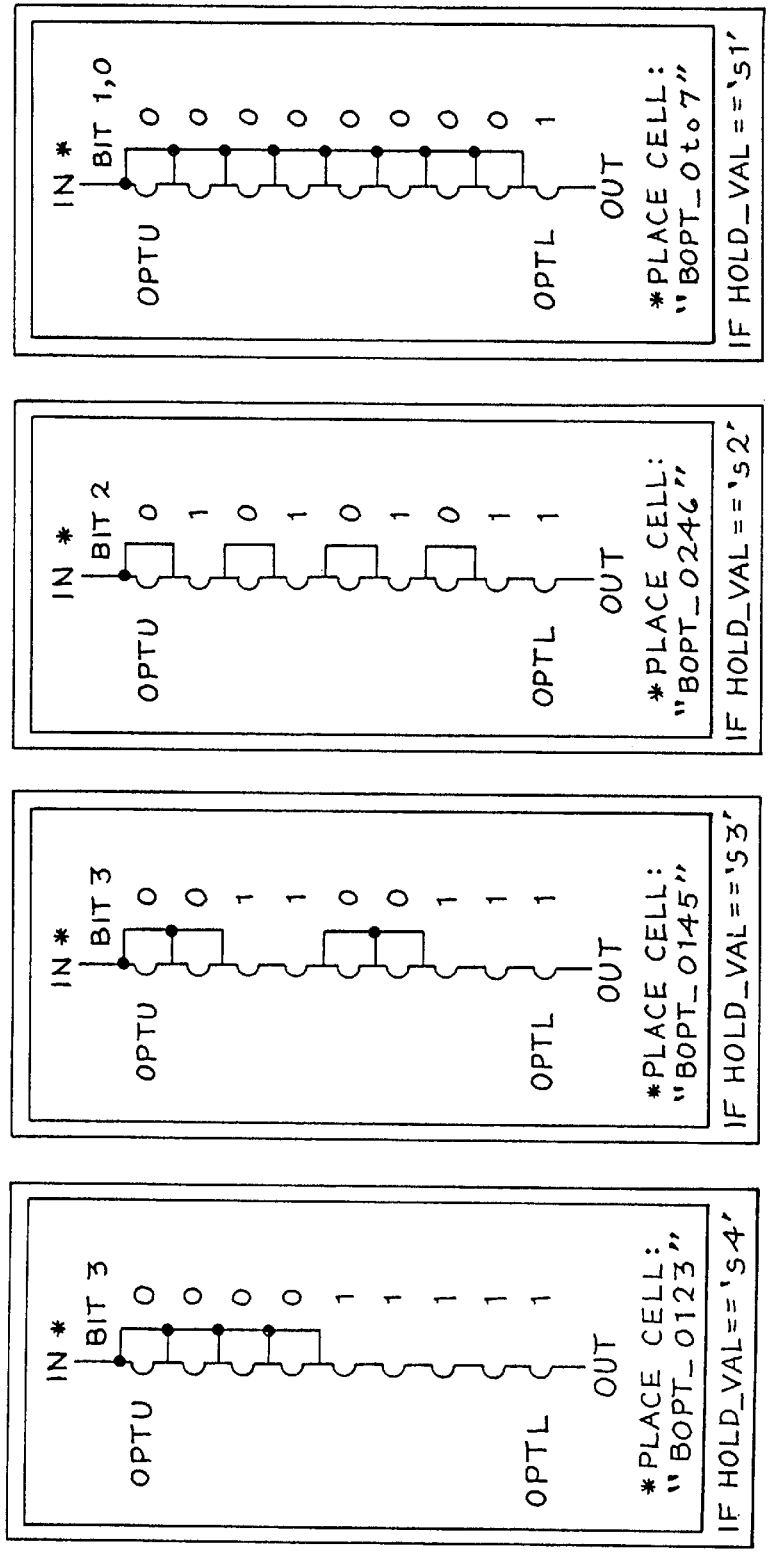

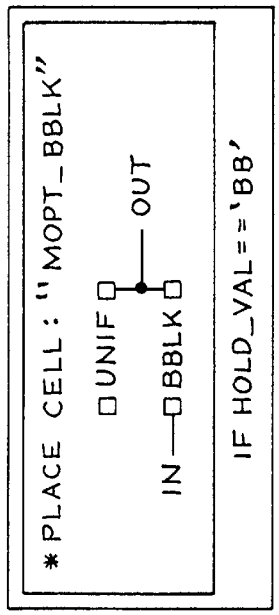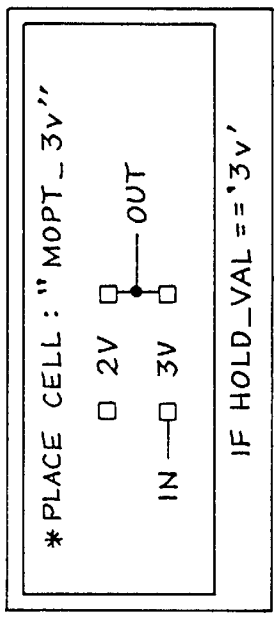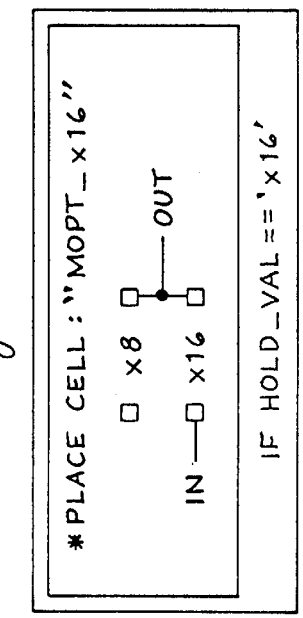

Fig. 10A

CFI TABLE

| 32Mbit, DL, CFI Register Set Summary ||||
|---|---|---|---|
| ADDR (HEX) | DL32x (HEX) | DLx32 (HEX) | NOTES |
| 10 | 0051 | 51 | ASCII "Q" |
| 11 | 0052 | 52 | ASCII "R" |
| 12 | 0059 | 59 | ASCII "Y" |
| 13 | 0002 | 02 | Primary Vendor Command Set & Control interface ID Code |
| 14 | 0000 | 00 | (02H for AMD / Fujitsu) |
| 15 | 0040 | 40 | Address for Primary Algorithm Extended Query Table |
| 16 | 0000 | 00 | (40H) |
| 17 | 0000 | 00 | Alternate Vendor Command Set and Control Interface ID Code |
| 18 | 0000 | 00 | (None) |
| 19 | 0000 | 00 | Address for Secondary Algorithm |
| 1A | 0000 | 00 | (None) |
| 1B | 0027 | 27 | VCC Logic Supply Minimum (2.7 Volt) |
| 1C | 0036 | 36 | VCC Logic Supply Maximum (3.6 Volt) |
| 1D | 0000 | 00 | VPP Programming Supply Minimum Write/Erase (No VPP) |
| 1E | 0000 | 00 | VPP Programming Supply Maximum Write/Erase (No VPP) |
| 1F | 0004 | 04 | Typical Timeout per Single Byte/Word Write (16 us) |
| 20 | 0000 | 00 | Typical Timeout for Max Buffer Write (Not Supported) |
| 21 | 000A | 0A | Typical Timeout per Individual Block Erase (1024 ms) |
| 22 | 0000 | 00 | Typical Timeout for Full Chip Erase (Not Supported) |
| 23 | 0005 | 05 | Maximum Timeout for Byte/Word Write (32 * 16 us) |
| 24 | 0000 | 00 | Maximum Timeout for Buffer Write (Not Supported) |
| 25 | 0004 | 04 | Maximum Timeout per Individual Block Erase (16 * 1024 ms) |
| 26 | 0000 | 00 | Maximum Timeout for Chip Erase (Not Supported) |
| 27 | 0016 | 16 | Device Size (4 MBytes) |
| 28 | 0002 | 00 | Flash Device Interface Description |
| 29 | 0000 | 00 | (00H = x8 asynchronous, 02H = x8/x16 asynchronous) |
| 2A | 0000 | 00 | Maximum Number of Bytes in Multi-Byte Write |
| 2B | 0000 | 00 | (Not supported) |
| 2C | 0002 | 02 | Number of Erase Block Regions Within Device |
| 2D | 0007 | 07 | Erase Block Region 1 Information |
| 2E | 0000 | 00 | |
| 2F | 0020 | 20 | |
| 30 | 0000 | 00 | |
| 31 | 003E | 3E | Erase Block Region 2 Information |
| 32 | 0000 | 00 | |
| 33 | 0000 | 00 | |
| 34 | 0001 | 01 | |

Fig. 10B

32Mbit, DL, CFI Register Set Summary

| ADDR (HEX) | DL32x (HEX) | DLx32 (HEX) | NOTES |
|---|---|---|---|
| 40 | 0050 | 50 | ASCII "P" |
| 41 | 0052 | 52 | ASCII "R" |
| 42 | 0049 | 49 | ASCII "I" |
| 43 | 0031 | 31 | Major Version Number, (ASCII-1) |
| 44 | 0031 | 31 | Minor Version Number, (ASCII-1) *Updated CFI Table Version x.1 - Modifies locations 4Ah, 4Ch, 4Dh, and 4Fh* |
| 45 | 0000 | 00 | Address Sensitive Unlock (00=required, 1=not required) |
| 46 | 0002 | 02 | Erase Suspend (00=not supported, 1=to read only, 2=to read/write) |
| 47 | 0001 | 01 | Sector Protection (00=not supported, x=number of sectors per group) |
| 48 | 0001 | 01 | Sector Temporary Unprotect (00=not supported, 01=supported) |
| 49 | 0004 | 04 | Sector Protect/Unprotect Scheme (01=29F040, 02=29F016, 03=29F400 mode) |
| 4A | * | * | Simultaneous Operation (00=not supported, x = number of sectors in bank 2) |
| 4B | 0000 | 00 | Burst Mode Type (00=not supported) |
| 4C | 0000 | 00 | Page Mode Type (00=not supported, 01=4 word page, 02=8 word page) |
| 4D | 0085 | 85 | ACC [Acceleration] Supply Minimum (8.5 Volt) |
| 4E | 0095 | 95 | ACC [Acceleration] Supply Maximum (9.5 Volt) |
| 4F | * | * | Top/Bottom boot sector location (02 = bottom boot, 03 = top boot) |

TABLE 55. COMMON FLASH MEMORY INTERFACE REGISTER SET (Cont.)

COMMON FLASH INTERFACE IMPLEMENTATION FOR A SIMULTANEOUS OPERATION FLASH MEMORY DEVICE

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Computers, personal digital assistants, cellular telephones and other electronic systems and devices typically include processors and memory. The memory is used to store instructions (typically in the form of computer programs) to be executed and/or data to be operated on by the processors to achieve the functionality of the device. In some applications, the systems and devices may require that the instructions and/or data be retained in some form of a permanent/non-volatile storage medium so that the information is not lost when the device is turned off or power is removed. Exemplary applications include computer BIOS storage and diskless handheld computing devices such as personal digital assistants.

One way to provide such non-volatile storage capability is to include a mass-storage device such as a hard disk drive. Hard disk drives are mechanical devices which store data on rotating magnetic platters. However, such devices may be difficult to fit in small systems and may have significant reliability, cost and manufacturing constraints. An alternative to such devices are integrated-circuit based non-volatile memories. One type of non-volatile memory that can be used is Erasable Programmable Read Only Memory ("EPROM"). While conventional EPROM's provide reliable non-volatile storage, they may not be able to be reprogrammed in the field in a practical manner. For example, EPROM's typically require exposure to ultraviolet light to erase them which may require that the EPROM memory chips be removed from the device. Once erased and reprogrammed, they are placed back in the device. In many applications, removing the memory to reprogram the device is not practical. In addition, besides not being easily reprogrammed, EPROM's may not have satisfactory data storage densities.

To avoid the complexity of EPROM's and to provide a device that can be reprogrammed in the field, many electronic designs use Electrically Erasable Programmable Read Only Memory ("EEPROM"), Static Random Access Memory ("SRAM") or flash memory, which can be reprogrammed electrically and without special hardware. SRAM is not technically a form of non-volatile memory but can be used in some applications requiring non-volatile capability.

EEPROM has the disadvantages of being expensive and having a very limited life cycle, i.e. an EEPROM can only be erased and rewritten a limited number of times before the device becomes non-functional. SRAM offers high operating speeds but only maintains its contents as long as power is supplied, therefore requiring a battery or other power source. This necessitates additional hardware to maintain power to the SRAM to preserve the stored contents which increases manufacturing cost and complexity. Further, the additional hardware may put undesirable constraints on the physical size of the design. In addition, EEPROM's and SRAM's may not have as high a data storage density as compared to other forms of storage. Therefore, where cost, size or density is a factor, flash memories are preferred because they may be simpler to reprogram in the field then EPROM's, less expensive than EEPROM's, easier to implement than battery-backed SRAM's and available in higher data storage densities.

Flash memory (or flash RAM) is a form of non-volatile storage which uses a memory cell design with a floating gate. High voltages are applied to the memory cell inputs to program/store charge on the floating gate or to erase/remove charge from the floating gate. Programming occurs by hot electron transfer to place charge on the floating gate while erasure makes use of Fowler-Nordheim tunneling in which electrons pierce through a thin dielectric material, reducing the amount of electronic charge on the floating gate. Erasing a cell sets the logical value of the cell to "1" while programming the cell sets the logical value to "0". Aside from programming or erasing operations, a flash memory operates similarly to a randomly accessible read only memory (ROM). Conventionally, a flash memory chip, including the flash memory storage cells and support logic/circuitry, is made by fabricating layers of semiconductor material and interconnect layers of polysilicon and first and second metal layers onto a substrate. It will be appreciated that there are numerous integrated circuit fabrication techniques, involving more or fewer layers, which are applicable herein.

Prior flash memories could only be erased by erasing the entire memory chip also known as bulk erasure. Byte by byte erasure was not possible. To somewhat alleviate this problem, modern flash memory is typically divided logically into blocks called "sectors" where each sector contains a portion of the total bytes of data storage available. For example, a typical flash memory may have 32 megabits of total storage and be logically broken down into 64 sectors, each sector containing 64 Kilobytes of data (one byte being equal to eight bits). This arrangement allows for the option of erasure of one sector at a time in addition to bulk erasure of the entire memory. While typical flash memories are still incapable of byte by byte erasure, data in the flash memory may still be programmed byte by byte (or sometimes word by word, where a word equals four bytes) depending on the implementation. It will be appreciated that the granularity by which a flash memory device can be programmed or erased may vary and that granularities down to bit level programming/erasure are contemplated.

In order to program and/or erase a flash memory, typically a complex process must be followed. For example, before erasing a particular sector, that sector must be programmed (known as "pre-programming"). These steps of erasing and programming involve complex application of high voltages to the memory cells for specified periods of time and in particular sequences. Many flash memories provide embedded state machines which perform the complex programming and erasing operations automatically. These processes of programming and erasing a flash memory may take a long time to complete. A typical erase sequence can take anywhere from 0.7 seconds up to 15 seconds per sector. To erase an entire chip can take up to 49 seconds depending on the number of sectors. While programming is much faster, on the order of 7 to 300 microseconds per byte, it is still slow compared to other memory devices. Programming an entire chip can still take up to 120 seconds (including the time to verify the data) depending on the capacity of the chip. Typically, standard Dynamic Random Access Memory ("DRAM") offers write access times on the order of nanoseconds, a difference between flash memory of many orders of magnitude.

This complex nature of programming and erasing flash memory devices leads to a major problem in that they do not provide sufficiently fast write access which then affects read accesses. For example, conventional flash memory devices typically do not allow a processor to perform a read operation while a program or erase operation is underway in the flash memory device. In most implementations, the processor is required to periodically poll a status register of the flash memory device to detect the end of the program or erase operation before initiating a read operation to the flash memory device.

Unfortunately, as noted above, the programming and erase cycle times for typical flash memory devices are orders of magnitude greater than acceptable write access times of a conventional random access main memory using, for example, Dynamic Random Access Memory ("DRAM"). Such long latencies associated with programming or erase operations can lock up the operating system and prevent the system from functioning for unacceptably long time intervals if the flash memory is the only memory in the electronic system. Some prior flash memories allow erase suspend operations in order to address this problem. Erase suspend allows the processor to pause an erase operation so another sector can be read. However, such memories typically still impose a suspend latency interval of several microseconds before a read operation can be initiated. A typical suspend latency interval is from 0.1 to 20 microseconds.

Prior systems may employ multiple flash memory devices in an attempt to prevent such operating system lock up. In such systems, the processor usually has read access to one of the flash memory devices while other flash memory devices are undergoing a program or erase operation. However, such systems typically suffer from high costs because multiple flash memory devices are implemented even though the capacity of a single flash memory device may accommodate the needs of the particular electronic device.

Another prior art system uses a flash memory in combination with an EEPROM memory. This system allows a read operation of one of the memories while writing to the other. However, the size of an EEPROM memory cell is significantly larger than that of a flash memory cell which reduces the amount of storage that can be placed on the memory chip. Further, there are significant design and manufacturing complexities involved with integrating two different memory technologies on the same chip. Therefore, a device which uses an EEPROM in combination with a flash memory will typically be more expensive both to design and manufacture.

In addition, programming and erasing a flash memory involves higher than normal voltages as compared to performing read operations. The use of these higher than normal voltages can cause problems when trying to implement the capability to simultaneously read while programming/erasing. Such problems include difficulties in distributing the high voltages required for the program and erase operations along with normal voltage for read operations and handling increased noise induced on the read sense outputs by the use of high voltages elsewhere within the device. Further, depending on the implementation, redundant logic may also be employed which introduces further complexities.

Accordingly, there is a need for an efficiently designed and manufacturable flash memory device that allows simultaneous read and write operations.

SUMMARY OF THE INVENTION

The present invention is defined by the following claims, and nothing in this section should be taken as a limitation on those claims. By way of introduction, one aspect of the present invention is a Common Flash Interface ("CFI") component which can be altered by changing only a single metal layer of the integrated circuit fabrication process. In another aspect of the present invention, the single metal layer is the second metal layer of the fabrication process. In yet another aspect of the invention, the CFI component is used in a flash memory device with a sliding bank architecture. This has the advantage that a substantial portion of the circuits which make up the CFI component can stay the same for various device configurations. For devices with different configurations, the designer need only alter the second metal layer for the CFI circuits to encode the configuration specific data. This implementation saves design as well as manufacturing time and cost and allows entire families of devices to share a common design database.

BRIEF DESCRIPTION OF THE DRAWINGS

FIG. 4 depicts a schematic diagram of a decoder to be used with the CFI_ROM of FIG. 3;

FIG. 6A depicts a schematic diagram of an array to be used with the CFI_ROM of FIG. 3;

FIG. 6B depicts a table indicating the bit encoding of the array of FIG. 6A;

FIGS. 9A–9K depict schematic diagrams of metal option circuit cells for use in the array of FIG. 6A;

FIGS. 10A–10B show a table detailing the address locations and encoding of common flash interface data stored in the array of FIG. 6A for an exemplary flash memory device.

DETAILED DESCRIPTION OF THE PRESENTLY PREFERRED EMBODIMENTS

Herein, the phrase "coupled with" is defined to mean directly connected to or indirectly connected with through one or more intermediate components. Referring now to the Figures and in particular, FIG. 1, there is schematically shown a flash memory device 100 according to the present invention that provides for reading while simultaneously undergoing a program or erase operation. The memory device 100 according to the present invention may include one or more components of the memory devices disclosed in U.S. Pat. No. 5,867,430 entitled "BANK ARCHITECTURE FOR A NON-VOLATILE MEMORY ENABLING SIMULTANEOUS READING AND WRITING," to Chen et al and U.S. Pat. No. 5,847,998 entitled "NON-VOLATILE MEMORY ARRAY THAT ENABLES SIMULTANEOUS READ AND WRITE OPERATIONS," to Van Buskirk, both of which are herein incorporated by reference and further describe the implementation and operation of a device of this type. The memory device 100 may also include one or more components of such exemplary flash memory devices capable of simultaneous read and write operation as the Am29DL162C and Am29DL163C 16 megabit ("Mb") flash memory chips and the Am29DL322C and Am29DL323C 32 Mb flash memory chips manufactured by Advanced Micro Devices, Inc. located in Sunnyvale, Calif. For more detail regarding these exemplary flash memory chips, refer to "Am29DL322C/Am29L323C 32 Megabit (4M×8-Bit/2M× 16-Bit) CMOS 3.0 Volt-only, Simultaneous Operation Flash Memory" Datasheet and "Am29DL162C/Am29L163C 16 Megabit (2M×8-Bit/1M×16-Bit) CMOS 3.0 Volt-only, Simultaneous Operation Flash Memory" Datasheet. While the exemplary devices disclosed above have capacities of 16 or 32 Mb, it will be appreciated that the embodiments disclosed herein are equally applicable to devices with higher bit densities such as 64 or 128 Mb devices.

In a typical embedded application of the above exemplary simultaneous operation capable flash memory 100, the available data storage space can be structured to store data and boot code in one bank and control code in another bank. The control code, which can contain command sequences which tell one bank, for example, bank 196, to program/erase data sectors, can reside as executable code in the alternate bank, for example bank 194. While the first bank is being programmed/erased, the system can continue to execute code from the alternate bank to manage other system operations. Similarly, depending on the system implementation, the CPU can also execute code from the first bank while the alternate bank undergoes a program/erase. There is no bank switching latency and no need to suspend the program/erase operation to perform the read. This minimizes the CPU's read/write cycle time, maximizes data throughput and reduces overall system cost by eliminating the need for additional hardware. It will be appreciated that while the exemplary devices have two banks of memory cells, devices with more than two banks are contemplated.

Figure 1:
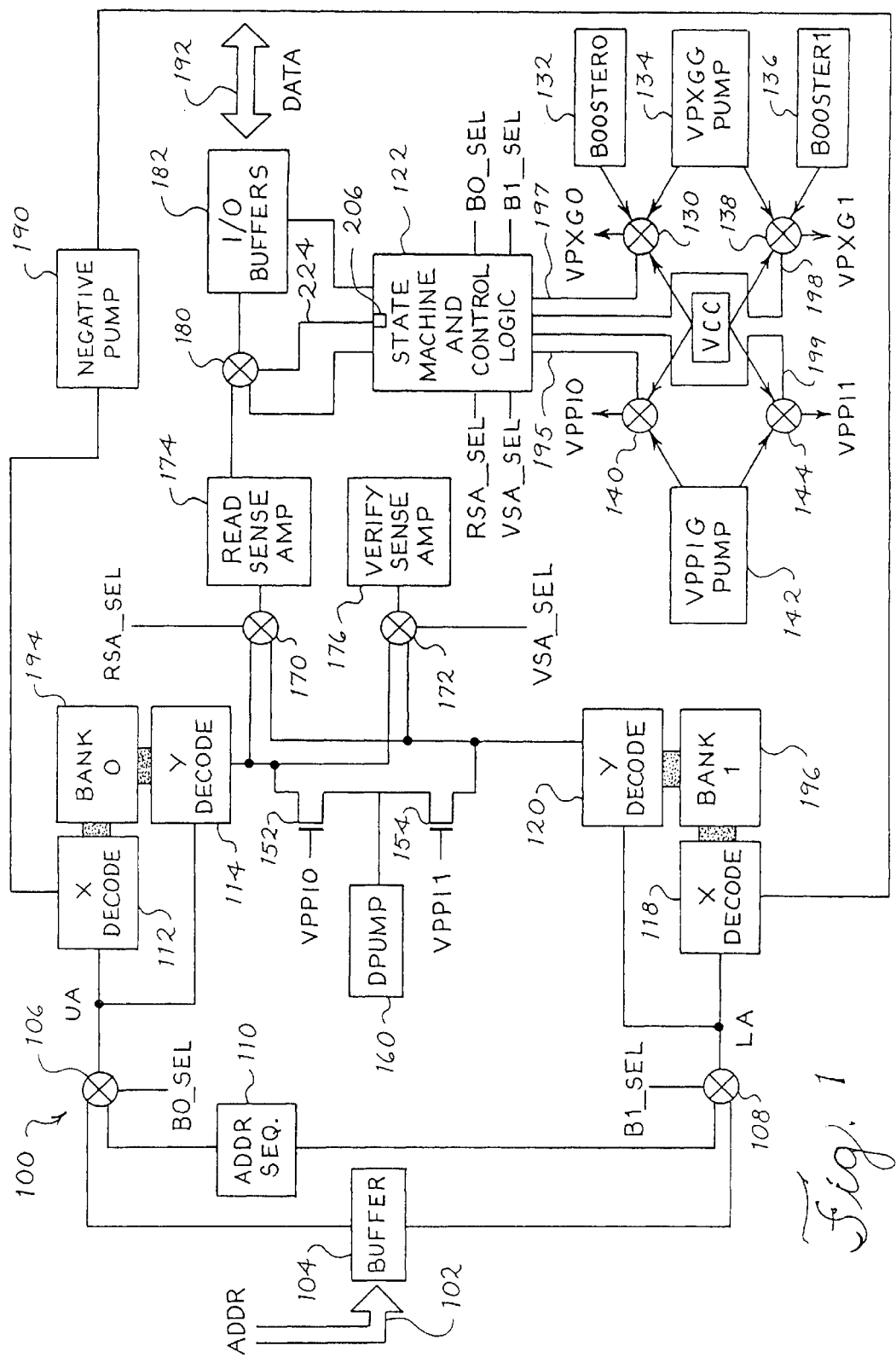
FIG. 1 depicts a block diagram of a flash memory chip according to the present invention that is capable of simultaneous reading and writing.

Again referring to FIG. 1, the memory device 100, according to an embodiment of the present invention with a capacity of 32 Mb and operating in word addressable mode, includes a 21 bit address input 102, a 16 bit data input/output ("DATA") 192, power inputs (not shown in FIG. 1) and control inputs (not shown in FIG. 1). It will be appreciated that the memory device 100 with a capacity of 16 Mb only requires 20 address bits and when operating in byte mode, the 32 Mb device 100 requires 22 address bits and the 16 Mb requires 21 address bits. The control inputs include Chip Enable, Output Enable, and Write Enable. The Chip Enable signal activates the chip's control logic and input/output buffers. When Chip Enable is not asserted, the memory device operates in standby mode. Output Enable is used to gate the outputs of the device through I/O buffers during read cycles. Write Enable is used to enable the write functions of the memory device. In one embodiment, all of the components of FIG. 1 are contained on a single integrated circuit chip. Note that address and control inputs for the exemplary flash memory chips are dependent on memory density and interface implementations. It will be appreciated that the disclosed embodiments can work with higher memory densities and alternate interface implementations with their accompanying alternate address and control input configurations.

The memory device 100 further includes address buffer 104, address multiplexers 106 and 108, address sequencer 110, X logical address decoders 112 and 118, Y logical address decoders 114 and 120, memory array Banks 0 and 1 denoted as 194 and 196 respectively, Dpump 160, data multiplexers 170 and 172, read sense amplifiers 174, verify sense amplifiers 176, negative pump 190, output multiplexer 180, state machine and control logic 122, input/output buffers 182, VPPIG Pump 142, booster 0 denoted as 132, VPXGG Pump 134, booster 1 denoted as 136 and power multiplexers 130, 138, 140 and 144. The address input 102 is received by the address buffer 104, which sends the address to the address multiplexer 106 for bank 194 and the address multiplexer 108 for bank 196. The address sequencer 110 is controlled by the state machine and control logic 122. In one embodiment, the address sequencer 110 is part of the state machine and control logic 122. The output of the address sequencer 110 is an address which is sent to both multiplexer 106 and multiplexer 108. The address sequencer 110 is used to generate sequential addresses during an erase sequence. The output of the multiplexer 106, upper address UA, is communicated to the X address decoder 112 and the Y address decoder 114. The output of the multiplexer 108, lower address LA, is sent to the X address decoder 118 and the Y address decoder 120. The multiplexer 106 chooses between the address from the buffer 104 and the address from the address sequencer 110 in response to a control signal B0_SEL. The multiplexer 108 chooses between the address from the address buffer 104 and the address from address sequencer 110 based on a control signal B1_SEL. The selection signals B0_SEL and B1_SEL are generated by the state machine and control logic 122.

Bank 194 and bank 196 are arrays (or sets) of flash memory cells (operation of these individual flash memory cells is discussed in more detail below). The banks 194, 196 are organized by words and then by sectors and can either be byte or word addressable. It will be appreciated by those skilled in the art that other types of non-volatile memory are also within the scope of the present invention. The address decode logic for bank 194 includes the X address decoder 112 and the Y address decoder 114. The X address decoder 112 includes a word line decoder and sector decoder. The word line decoder receives address bits UA[6:14] and the sector decoder receives address bits UA[15:20]. The Y address decoder 114 includes a bit line decoder and Y bit line gating. The bit line decoder receives address bits UA[0:5].

The address decode logic for bank 196 includes the X address decoder 118 and the Y address decoder 120. The X address decoder 118 includes a word line decoder and a sector decoder. The word decoder receives address bits LA[6:14] and the sector decoder receives address bits LA[15:20]. The Y address decoder 120 includes a bit line decoder and Y bit line gating. The bit line decoder receives address bits LA[0:5]. In one embodiment, the address buffer 104 includes a latch to store the address being decoded. In another embodiment, the latch can be part of the decoders 112, 114, 118, 120.

FIG. 1 further shows a multiplexer 130 with three inputs: booster zero 132, VPXGG pump 134 and Vcc. The VPXGG pump 134 is a positive power supply for generating and supplying a regulated positive potential to the control gate of selected flash memory cells via the word lines. Many different voltage pumps known in the art are suitable for use in the present invention. A more detailed explanation of one technology which can be included in VPXGG pump 134 can be found in U.S. Pat. No. 5,291,446, "VPP POWER SUPPLY HAVING A REGULATOR CIRCUIT FOR CONTROLLING A REGULATED POSITIVE POTENTIAL" to Van Buskirk et al, the entire contents of which are incorporated herein by reference. Booster 132 is used to boost the word line during reads. The multiplexer 130 receives a selection signal 197 from state machine and control logic 122 and chooses one of its three inputs to send to the word lines of bank 194 via the X address decoder 112. The output of the multiplexer 130 is labeled as VPXG0. FIG. 1 is drawn to show the three inputs 132, 134 and Vcc connected to a multiplexer in order to simplify the disclosure. A more detailed description of one exemplary implementation can be found in U.S. Pat. No. 5,708,387, "FAST 3-STATE BOOSTER CIRCUIT", to Cleveland et al, the entire contents of which are incorporated herein by reference. Many booster circuits and selection circuits known in the art are suitable for use in the present invention.

FIG. 1 also includes another multiplexer 138 having three inputs: booster one denoted as 136, VPXGG pump 134 and Vcc. Booster 136 is similar to booster 132. The multiplexer 138 operates in a similar fashion to multiplexer 130, and receives its selection signal 198 from the state machine and control logic 122. The output of multiplexer 138 is VPXG1 which is sent to the word lines of bank 196 via the X address decoder 118. The purpose of the multiplexers 130 and 138 is to switch between the three power lines depending on the operation being performed on the particular bank of memory cells.

The VPPIG pump 142 is a high voltage pump used to pass high voltage to the drain of the memory cells. The output of the VPPIG pump 142 is sent to multiplexer 140 and multiplexer 144. Both multiplexers also have Vcc as an input. Multiplexers 140 and 144 switch between inputs based on signals 195 and 199 from the state machine and control logic 122. The output of multiplexer 140 is VPPI0 and the output of multiplexer 144 is VPPI1. During a normal read operation, VPPI1 and VPPI0 are connected to Vcc. VPPI0 is connected to the gate of an N-channel transistor 152. VPPI1 is connected to the gate of an N-channel transistor 154. The source of transistor 152 is connected to Y address decoder 114, multiplexer 170 and multiplexer 172. The drain of transistor 152 is connected to the Dpump 160 and the drain of transistor 154. The Dpump 160 is a drain power supply. Various drain power supplies, known in the art, can be used for the present invention. One exemplary drain pump is disclosed in U.S. Pat. No. 5,263,000, "DRAIN POWER SUPPLY", to Van Buskirk, et al., the entire contents of which are incorporated herein by reference. The source of transistor 154 is connected to multiplexer 170 and multiplexer 172. The source of transistor 154 is also connected to Y address decoder 120 for purposes of accessing the bit lines in bank 196. The connections to multiplexers 170 and 172 provide a path for reading data from bank 194 and bank 196. Multiplexer 170 uses the signal RSA_SEL from the state machine and control logic 122 to selectively choose one of the two input signals to communicate to the read sense amplifiers 174. Multiplexer 172 uses the selection signal VSA_SEL from the state machine and control logic 122 in order to selectively communicate one of its two input signals to the verify sense amplifiers 176. Thus, the two transistors (152 and 154) and the two multiplexers (170 and 172), are used to selectively pass voltages to the drains of selected cells in bank 194 or bank 196 and to selectively read data from either bank 194 or bank 196. For the sake of clarity, the implementation of multiplexers 170 and 172 is illustrative only. Some of the implementation details are not shown in FIG. 1. In the memory device 100, there are actually two sets of sense amplifiers, one set for each bank 194, 196. There are also two sets of verify sense amplifiers. Data from the banks is multiplexed from each bank 194 or 196 to either its read sense amplifier or its verify sense amplifier. When a bank 194 or 196 is using its read sense amplifier, its verify sense amplifier is turned off and vice versa. It will be appreciated that there are many ways to multiplex multiple data sources among multiple destinations.

Data from either bank 194 or bank 196 can be communicated to either the read sense amplifiers 174 or the verify sense amplifiers 176. Both sense amplifiers are in communication with the state machine and control logic 122. While data from bank 194 is communicated to the read sense amplifiers 174, data from bank 196 can be communicated to the verify sense amplifiers 176. While data from bank 194 is communicated to the verify sense amplifiers 176, data from bank 196 can be communicated to the read sense amplifiers 174. The output of the verify sense amplifiers 176 is sent to the state machine and control logic 122, which is used to verify that a particular byte has been programmed or erased. Note that in the memory device 100, the preferred implementation of the read sense amplifiers 174 provides two sets of sense amplifiers, one for each bank 194, 196. Only the sense amplifiers for the bank 194 or 196 undergoing a read operation are active during the read operation. The verify sense amplifiers 176 of the memory device 100 also have two sets of verify amplifiers, one for each bank.

Data from the read sense amplifiers 174 is sent to multiplexer 180. A second input of the multiplexer 180 includes device 100 status information from the state machine and control logic 122 such as whether or not a program or erase is in progress. The selection signal for multiplexer 180 is provided by the state machine and control logic 122.

I/O buffers 182 are used to pass data out and receive data into memory device 100. While a read is being performed on one of the banks, multiplexer 180 will communicate output data from read sense amplifiers 174 to I/O buffers 182. During an erase or program sequence, multiplexer 180 will communicate status information to I/O buffers 182 so that an outside processor can poll the memory device 100 for the status in regard to the erase or program.

The memory device 100 also includes a negative pump 190 that is used to generate a relatively high negative voltage to the control gates of selected memory cells via the word lines of either bank 194 or bank 196, as selected by the state machine and control logic 122. The negative pump 190 is in communication with the X address decoders 112 and 118. One example of a negative pump can be found in U.S. Pat. No. 5,612,921, "LOW SUPPLY VOLTAGE NEGATIVE CHARGE PUMP", to Chang et al, the entire contents of which are incorporated herein by reference.

The state machine and control logic 122 provides the control for read, program and erase operations. Many of the selection lines used to select between bank 194 and bank 196 are controlled by the state machine and control logic 122. Alternatively, the output from the X and Y address decoders 112, 114, 118, 120 can be used to select between banks of memory cells.

The memory device 100 is programmed using an embedded programming sequence and is erased using an embedded erase sequence. The embedded sequences allow a processor to initiate a program or erase sequence and perform other tasks while the program and erase sequences are being carried out. The embedded program and erase sequences are controlled by the state machine and control logic 122, which uses a command register to manage the commencement of either sequence. The erase and programming operations are only accessed via the command register which controls an internal state machine that manages device operations. Commands are written to the command register via the data inputs 192 to the memory device 100.

While one bank is being programmed, the other bank can be accessed for a read operation. For example, during a program of a byte in bank 196, the state machine and control logic 122 would cause multiplexer 108 to select the address from buffer 104 for communication to decoders 118 and 120. Further, the state machine and control logic 122 would store the data byte to be programmed from the I/O buffers 182 for verification when the programming completes. The output of bank 196 would be sent to the verify sense amplifiers 176 via multiplexer 172 for comparison with the stored input data. During a simultaneously initiated read operation to bank 194, the state machine and control logic 122, after storing away the data to be programmed, instructs multiplexer 106 to select the address from the buffer 104 for communication to the X and Y address decoders 112 and 114. The output of bank 194 would be sent to the read sense amplifiers 174 via multiplexer 170. The output of the read sense amplifiers 174 would be sent, via multiplexer 180, to the I/O buffers 182 and then to the data bus 192.

Similarly, during an erase of a sector in bank 194, the state machine and control logic 122 would cause multiplexer 106 to select the addresses from the address sequencer 110. The address sequencer 110 would be used to cycle through all the bytes in a particular sector to make sure that each byte is preprogrammed. The sector is subsequently bulk erased. After erasure, the address sequencer 110 would be used to generate addresses to verify each byte of this erased sector. While bank 194 is being erased and multiplexer 106 is selecting an address from the address sequencer 110, a read operation can be carried out in bank 196 by using multiplexer 108 to select the address from the buffer 104 rather than an address from address sequencer 110. During the verify operation of the erase method for bank 194, the state machine and control logic 122 would be verifying the data using the verify sense amplifiers 176, while read data from bank 196 would be communicated to the read sense amplifiers 174. Thus, each bank has two input address paths and two output data paths that can be multiplexed so that either bank can be read from while the other bank is simultaneously being written to.

In the memory device 100, each memory cell, within the banks 194 or 196, includes a nor-type floating gate transistor. It will be appreciated by those skilled in the art, however, that there are many ways to implement a flash memory cell and that the configurations and operating characteristics may vary. It will further be appreciated that the embodiments disclosed herein are generally applicable and not limited to one particular implementation of a flash memory cell. The exemplary transistor has three connections called the source, drain and control gate. In a typical flash memory array, the control gates of the memory cells are connected to the word lines of the array which are used to address the data stored in the array. The sources are selectively connected to ground (for a read operation) depending on which bits are to be read. The drains are connected to the bit lines which are used to sense/read the stored data out of the array.

During an erase operation, the source input of the memory cell transistor is connected to a high positive voltage, the drain/bit line is left to float and the control gate/word line is connected to a relatively high negative voltage supplied by the negative pump 190. An exemplary high positive voltage applied to the source during an erase is approximately 5 volts and an exemplary high negative voltage applied to the control gate/word line by the negative pump 190 is approximately minus 9 volts although other voltages and input combinations can be used. Based on this input configuration, any charge stored on the floating gate of the memory cell transistor will discharge by flowing out to the source due to Fowler-Nordheim Tunneling.

During a program operation, the source input of the memory cell transistor is connected to ground, the drain/bit line is connected to a high positive voltage provided by the VPPIG Dpump drain power supply 142 and the control gate/word line is connected to a high voltage provided by the VPXGG pump positive power supply 134. An exemplary high voltage applied to the drain by the VPPIG 142 is approximately 5 Volts while an exemplary high voltage applied to the control gate by the VPXGG 134 pump is approximately 9 Volts. It will be appreciated by those skilled in the art that other voltage and input combinations can also be used. Based on this input configuration, charge will flow by hot electron transfer to the floating gate of the memory cell transistor and accumulate there.

While programming and erasing the memory cell require higher than normal voltages, reading from the cell only requires the availability of the normal supply voltage. To read from the memory cell, the source is connected to ground (also referred to as Vss) and the control gate/word line are connected to the booster power supplies 132, 136. Prior to selecting the transistors for a read, the bit lines are charged up via the Dpump 160. When the cells turn on (if erased), they will connect their respective bit line to ground, grounding out the bit line. The current value of the memory cell is then sensed from the drain/bit line connection. There is a booster power supply 132 for bank 194 and a booster power supply 136 for bank 196. The booster power supplies 132, 136 are used to boost the word lines of bank 194 or bank 196 during a read operation. An exemplary Vcc supply voltage is 3.0 Volts although other supply voltages are known in the art. An exemplary booster voltage is 5.0 Volts, although the use of the other voltages on the control gate for read operations is possible. If there is charge stored on the floating gate, i.e. the memory cell has been programmed, the flow of current from the drain to the source (ground) will be inhibited and the memory cell will read as a logical "0". If the memory cell has been erased, there will be no charge stored on the floating gate and with a voltage applied to the control gate greater than the threshold voltage of the transistor, current will flow from the drain to the source and the memory cell will read as a logical "1". Note that a transistor that is on, grounds its respective bit line. Data read out of the array is considered in its complimentary form, therefore the grounded bit lines are interpreted as logical 1's and the non-grounded bit lines are considered logical 0's.

Application of the particular voltages necessary for each operation is handled by the state machine and control logic 122. This logic 122 controls the multiplexers 130, 138, 140, 144 that place the proper voltages from the various power supplies 132, 134, 136, 142 and Vcc on the memory cell inputs depending on the desired function.

While the total capacity of the simultaneous read and write capable flash memory device 100 is 16 or 32 MB or higher, how that capacity is distributed among the available banks is variable. Users of simultaneous read and write capable flash memory may need different bank partition sizes depending on their applications. To meet the varying needs of users, the flash memory device 100 preferably implements a sliding bank architecture. This architecture allows the simplified design and manufacture of simultaneous flash memory devices with varied bank partition sizes. To alter the bank sizes, only a single metal layer of the chip needs to be altered. For a more detailed discussion of the sliding bank architecture, refer to co-pending and commonly assigned U.S. patent application Ser. No. 09/159,142, "SIMULTANEOUS OPERATION FLASH MEMORY DEVICE WITH A FLEXIBLE BANK PARTITION ARCHITECTURE", filed Sep. 23, 1998, U.S. patent application Ser. No. 09/159,023, "METHOD OF MAKING FLEXIBLY PARTITIONED METAL LINE SEGMENTS FOR A SIMULTANEOUS OPERATION FLASH MEMORY DEVICE WITH A FLEXIBLE BANK PARTITION ARCHITECTURE", filed Sep. 23, 1998 and U.S. patent application Ser. No. 09/159,489, "BANK SELECTOR CIRCUIT FOR A SIMULTANEOUS OPERATION FLASH MEMORY DEVICE WITH A FLEXIBLE BANK PARTITION ARCHITECTURE", filed Sep. 23, 1998, the entire contents of each of which are incorporated herein by reference. The sliding bank architecture enables the memory device 100 to be produced in many different configurations with only a single mask change in one of the final steps of production. In the case where the flash memory device 100 has a capacity of 32 megabits (Mb), partitions where bank 194 has a capacity 4 or 8 Mb and bank 196 has a capacity of 28 or 24 Mb respectively, can be used. In the case where the flash memory device 100 has a capacity of 16 Mb, partitions where bank 194 has a capacity of 2 or 4 Mb and bank 196 has a capacity of 14 or 12 Mb respectively, can be used. This has the advantages that many different configurations of the flash memory device 100 can share much of the same basic design, process and manufacturing expense.

As used herein, the phrase "high logic level" is used to indicate a logical 1 and the phrase "low logic level" is used to indicate a logic level of 0. It will be understood that the signals underlying these representations are actually represented by voltage values. A signal is said to be "asserted" when it has a value which is significant to the logic it is driving. Some signals are asserted when they are at a low logic level (also referred to as "active low" and labeled with a bar over the signal name or a B appended to the end of the signal name) and some signals are asserted when they are at a high logic level (also referred to as "active high"). It will be appreciated that all forms of digital logic representations are contemplated including mixed logic and multi-state representations. It will further be appreciated that the underlying voltages of the logic signals may also vary, with exemplary values being 2 or 3 Volts representing logic 1 and 0 Volts representing logic 0.

In one embodiment of the present invention, an alterable Common Flash Interface ("CFI") component is provided. The CFI is an industry specification in use by the various manufacturers of flash memory devices. The industry specification defines that certain device information be stored on the device itself and be accessible by a specified interface. The industry specification outlines which information/characteristics of the device is stored, such as the size/capacity of the device, the operating voltage level, the geometric arrangement of the storage array and other capability and configuration information about the particular flash memory device. Such information further includes whether or not the device is capable of simultaneous operation and the location of the boot blocks. The industry specification further provides the encoding of this information and a standardized command set/interface so that it can be retrieved by the user.

The CFI Specification is produced by a consortium of flash memory producers and it will be appreciated that this specification and the capabilities that it outlines may change. In particular, the CFI Specification is available from Advanced Micro Devices, located in Sunnyvale, Calif. The CFI Specification outlines the device and host system software interrogation handshake which allows specific vendor-specified software algorithms to be used for entire families of devices. This allows device-independent, Joint Electron Device Engineering ("JEDEC")-ID-independent, and forward- and backward-compatible software support for the specified flash device families. It allows flash memory vendors to standardize their existing interfaces for long term compatibility.

The CFI Specification defines a basic Query interface structure for CFI-compliant devices. This allows parameterization of known and future flash Read/Write/Erase control interfaces. This Query structure attempts to define all of the critical parameters relevant to a broad base of flash memory devices. The CFI Specification specifies a 16 bit identification code as part of the parameters which identifies the manufacturer so that users of a particular flash memory can obtain the device specific information directly. Such device specific information includes command sets, status polling methods and software algorithms.

A companion document to the CFI Specification is the CFI Publication 100 which documents identification code assignments for the vendor-specific command set and control interfaces as well as the device interfaces.

The CFI component may encode a substantial amount of information about the particular flash memory chip. Such information includes: whether or not this chip is a uniform or bootblock configured device; the operating voltage of the chip; whether the data storage array is 8 bits or 16 bits wide; the bank size for a simultaneous operation chip; and the location of the bootblack. In the exemplary flash memory chip, the chip is available with a uniform memory array or in a bootblack configuration. A bootblock configured device has an asymmetric sector architecture where the first sector is of a smaller size than the remaining sectors, typically 8 or 16 KB as compared to the remain sectors which are typically 64 KB. This sector is intended to replace boot programmable read only memory and it can be used in applications where the device containing the flash memory will be storing boot up code. Other applications can also make use of this special bootblock memory. In a uniform configured device, all of the sectors in the flash array are of a uniform size. Further, the device is also available in versions which operate at different operating voltages such as 2 Volt and 3 Volt. In the case of the memory device 100 having a memory capacity of 32 Mb it is possible to configure the device as an 8 bit by 4 mega-row array or as a 16 bit by 2 mega-row array. In addition, for devices configured as a bootblock device, there is the option to have the bootblock located at the top of the address range or the bottom of the address range of the device. It will be appreciated that there may be other options which may vary from device to device and that the categories of options listed herein may have other option choices associated with them and that all such options and choices are contemplated.

With so many device options, it may be advantageous to utilize a single CFI component design with only minor modifications to set the values of the CFI options for the memory device 100. Conventionally, a flash memory chip, including the flash memory storage cells and support logic/circuitry, is made by fabricating layers of semiconductor material and interconnect layers of polysilicon and first and second metal layers onto a substrate. It will be appreciated that there are many methods of fabricating flash memory devices and their supporting logic/circuitry and that all such methods, both now available and later developed, are contemplated. For the memory device 100, preferably, the CFI component is partially constructed on a memory chip 200 using the second metal layer which is also used to partition the memory array banks (the sliding bank architecture is discussed in more detail above) near the final step of manufacture. In this way, the majority of the CFI logic is shared among differently device configurations. Only the final metal step in the integrated circuit fabrication process changes depending on the final chip configuration. The option information is then encoded using only this second metal layer. The manufacturing process for a family of devices is therefore simplified and the manufacturing cost is reduced. It will be appreciated that the embodiments disclosed herein may be applicable to flash memory devices without a sliding bank architecture as well as devices which do not provide for simultaneous read and write operation.

Figure 2:
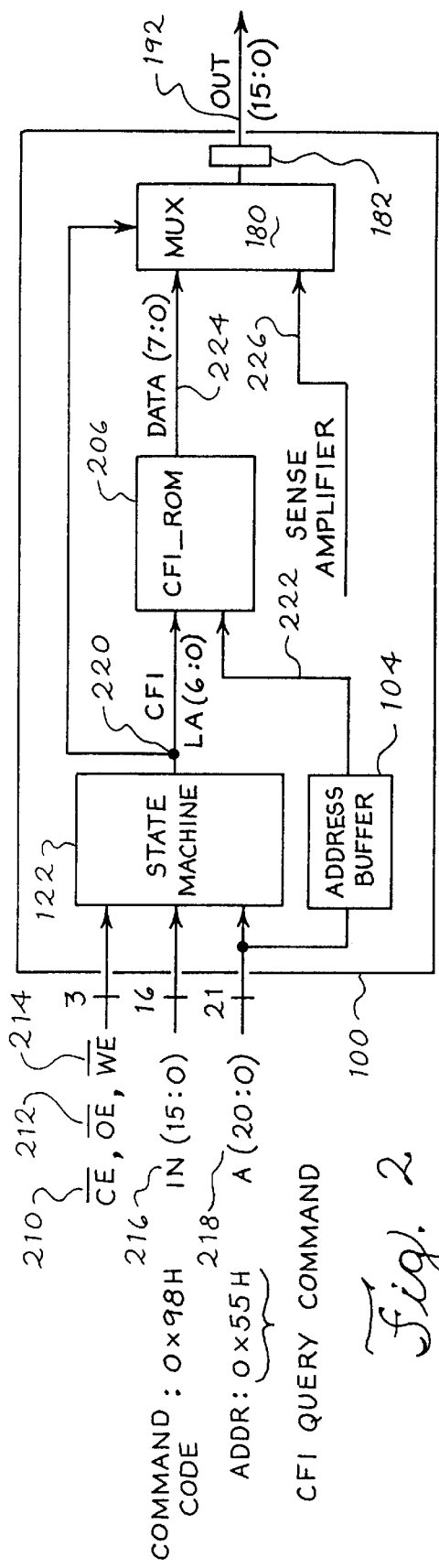
FIG. 2 schematically depicts the implementation of a Common Flash Interface for the flash memory chip of FIG. 1.

Referring to FIG. 2, there is shown schematic specification depicting how the memory device 100 of FIG. 1 incorporates a CFI component 206 (labeled "CFI_ROM") according to the present invention. For the sake of clarity, a number of elements of FIG. 1 have been eliminated leaving a state machine 122, address buffers 104, CFI_ROM 206 and output multiplexor 180. The state machine 122 includes inputs for chip enable (labeled "CE") 210, output enable (labeled "OE") 212, write enable (labeled "WE") 214, a 16 bit data bus (labeled "IN(15:0)") 216 and a 21 bit address bus (labeled "A(20:0)") 218. Utilizing the CFI Specification, the value of 0x55 hexadecimal is placed on the address bus 218 and a value of 0x98 hexadecimal is placed on the data bus 216 to initiate the query command for the CFI_ROM 206. Note that any input configuration can be used to initiate the query command for the CFI_ROM 206. The state machine 122 includes an output for a CFI signal 220 which activates the CFI_ROM 206 for reading data. The CFI signal 220 is an active high signal that indicates that the device 100 is in CFI mode when high. The address buffers 104 include an input for the address bus 218 as well. The address buffers 104 further includes an address output, (labeled "LA(6:0)") 222. The address buffers 104 buffer and send the lower 7 bits of the address to the CFI_ROM 206. The CFI_ROM 206 (discussed in more detail below) includes inputs for the CFI signal 220 from the state machine 202 and 7 bit address output 222, LA(6:0), from the address buffers 104. The CFI_ROM 206 further includes an 8 bit data output (labeled "DATA(7:0)") 224, which is connected to the output multiplexor 180. The output multiplexor 208 includes an input for the CFI signal 220 from the state machine 122 and the data output 224 from the CFI_ROM 206. It further has inputs 226 for the read sense amplifiers 174 of the main memory array. The output multiplexor 180 also includes an output 228, (labeled "OUT(15:0)") to transmit data to the buffers 182 and off the chip. It will be appreciated that other input and output configurations are possible for the memory device 100 as well as alternate internal configurations. For example, the state machine 122 could also be implemented as combinational logic. Further, dedicated inputs and outputs may be provided for the CFI functions. It will also be appreciated that the disclosed architecture may be fabricated by many different processes known to those in the art.

The state machine 122 controls all of the functions of the memory device 100. Upon receipt of the proper command sequence according to the CFI specification, the state machine 122 asserts the CFI signal 220 to the CFI_ROM 206 which tells the CFI_ROM 206 to use the address provided by the address buffers 104 and provide the requested data. The CFI_ROM 206 then provides the data to the output multiplexor 180 which is also under control of the state machine 122 and also receive the CFI signal 220. The output multiplexor 180, responding to the CFI signal 220 from the state machine 202, then selects and passes the CFI data to the chip output buffers 182 and then to the chip outputs 192, OUT(15:0).

Figure 3:
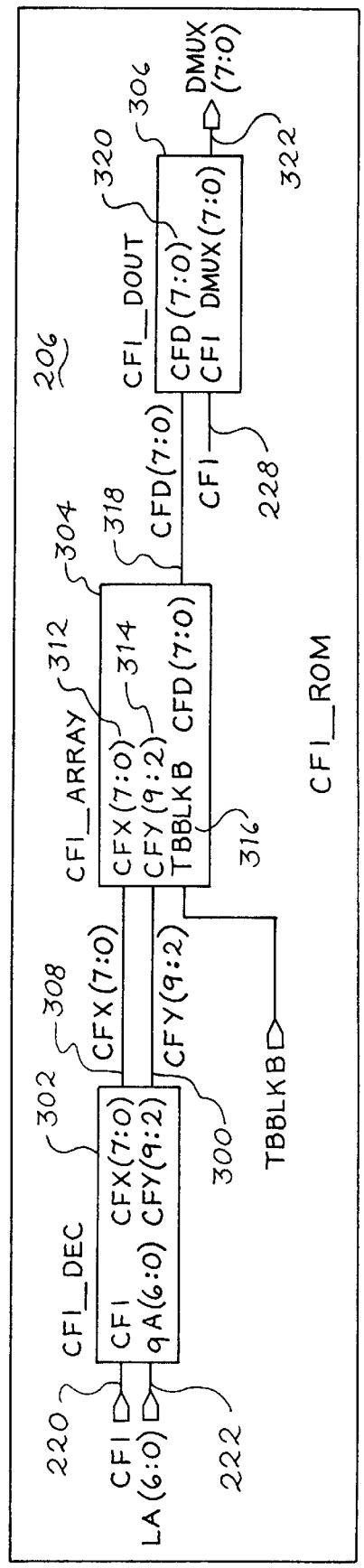
FIG. 3 depicts a schematic diagram of a preferred embodiment of a Common Flash Interface ROM component ("CFI_ROM") to be used with the flash memory chip of FIGS. 1 and 2.

Referring to FIG. 3, there is shown a schematic diagram of a preferred CFI_ROM 206 according to the present invention. The CFI_ROM 206 includes decoder (labeled "CFI_DEC") 302, a CFI array (labeled "CFI_ARRAY") 304 and an output sense amplifier (labeled "CFI_DOUT") 306. The decoder 302 includes an input for the CFI signal 220 from the state machine 122 and an input, qA(6:0), for the address 222 from the address buffers 104, LA(6:0). Further, the decoder 302 provides outputs 308 and 310 (labeled "CFX(7:0)" and "CFY(9:2)") which are connected to the CFI array 304. The decoder 302 decodes the 7 bit address into an 8 bit X signal and an 8 bit Y signal for access into the CFI array 304. The decoder 302 is discussed in more detail below.

The array 304 includes inputs 312 and 314 (labeled "CFX(7:0)" and "CFY(9:2)") for the X and Y decoded address from the decoder 302 as well as an input for a top bootblock signal 316 (labeled "TBBLKB"). In the illustrated embodiment, the top bootblock signal is preferably an active low signal which indicates that this device is configured with the bootblock located at the top of the address range of the device. This signal 316 comes from other logic on the chip which determines the location of the bootblocks (at the top of the address space of the device 100 or the bottom) for a bootblock configured device. For a uniform configured device, the TBBLKB signal 316 is ignored. The CFI array 304 further includes a data output 318 (labeled "CFD(7:0)") which is connected to the output sense amplifier 306. The CFI array 304 is discussed in more detail below.

The output sense amplifier 306 includes inputs 320 for the data from the CFI array 304, (labeled "CFD(7:0)") and the CFI signal 220 from the state machine 202. The output sense amplifier 306 further includes an output 322 (labeled "DMUX(7:0)") which is connected to the output multiplexer 180. The output sense amplifier 306 is discussed in more detail below.

Referring to FIG. 4, there is shown a schematic diagram of an exemplary decoder 302. As discussed above, the decoder 302 decodes the 7 bit address into 8 bit X and Y array coordinate locations for the desired data. These signals activate the data storage cells in the CFI array 304 to pass their contents out. The decoder 302 is implemented with the combinational logic shown in the figure. It will be appreciated that there are many ways to implement the decoder 302. Note that the CFX(7:0) outputs 308 of the decoder 302 are preferably active low although active high signals can also be used with appropriate modifications to the CFI array 304.

Figure 5:
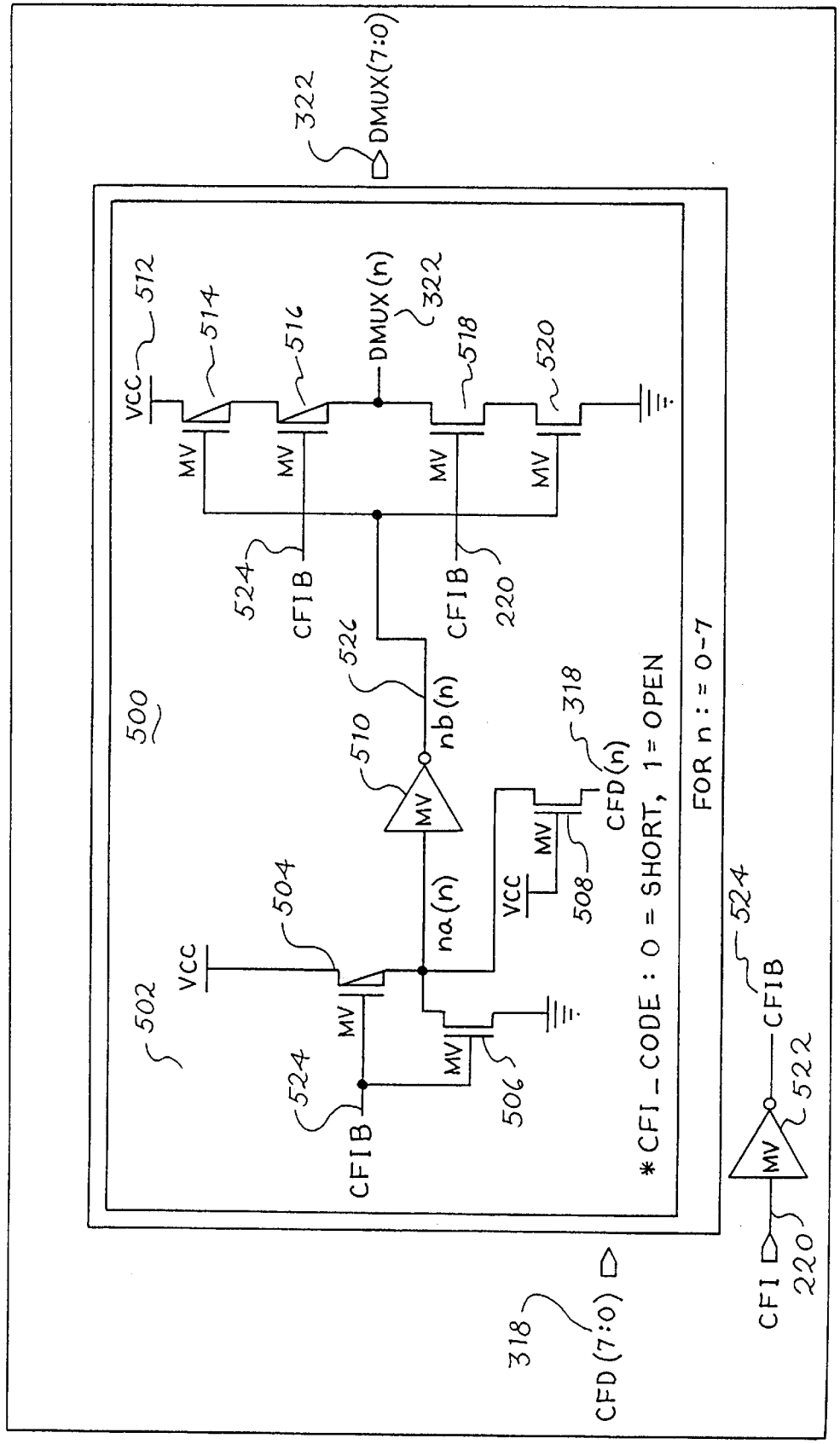
FIG. 5 depicts a schematic diagram of a sense amplifier cell for use with the CFI_ROM of FIG. 3.

Referring to FIG. 5, there is shown a schematic diagram of a preferred sense amplifier cell 500 for use in the output sense amplifier 306 of FIG. 3. There is one sense amplifier cell 500 for each of the 8 data outputs 318 CFD(7:0) from the CFI array 304. The cell also has inputs for the CFI signal 220 from the state machine 202 and the inverted CFI Signal 524. CFIB 524 is generated by inverter 522. The cell 500 includes an activation circuit 502 which includes p-channel transistor 504 and n-channel transistors 506 and 508. When CFIB is high (CFIB is low indicating normal operating mode), transistor 504 is on and transistor 506 is off connecting the input to buffer 510 to Vcc. When CFIB is low (CFI is high indicating CFI mode), transistor 504 is off and transistor 506 is on. This effectively connects the data input CFD(n) to buffer 510. The cell 500 further includes an output stage 512 which includes p-channel transistors 514 and 516 and n-channel transistors 518 and 520. When CFI is high (CFI is low), transistors 516 and 518 will be on. The output 526 of the buffer 510 (which is the inverted data output of the array 304) will then control transistors 514 and 520. If the output 526 is 0 (indicating a 1 stored in the array 304), transistor 514 will turn on and transistor 520 will turn off allowing Vcc to flow to the output 322 of the cell and on to the output multiplexer 208, effectively outputting a 1. If the output 526 of the buffer 510 is 1 (indicating a 0 is stored in the array), transistor 514 will turn off and transistor 520 will turn on connecting the output 322 of the cell to ground and effectively outputting a zero to the output multiplexer 208. If the CFI signal is low, transistors 516 and 518 will turn off, cutting off the array 304 from the output multiplexer 208.

Exemplary transistor parameters are as illustrated and the dimensions are in micrometers. Transistor 504 has a channel width to length ratio of 3.0/3.5. Transistor 506 has a channel width to length ratio of 2.3/0.7. Transistor 508 has a channel width to length ratio of 20/0.7. Transistor 514 has a channel width to length ratio of 15/0.7. Transistor 516 has a channel width to length ratio of 15/0.7. Transistor 518 has a channel width to length ratio of 8/0.7. Transistor 520 has a channel width to length ratio of 8/0.7. Inverter 510 has parameters of 6/1 and 3/1. Inverter 522 has parameters of 15/0.7 and 8/0.7. It will be appreciated that other channel width to length ratios as well as other transistor types, now or later developed, may be used.

Referring to FIGS. 6A and 6B, there is shown a schematic diagram of the preferred CFI array 304 for storing the CFI specification data and the encoding of the data bits in the array 304. The preferred CFI array 304 is constructed as 8 bit wide by 64 bit deep array thereby holding 64 bytes of data. The CFI array 304 is constructed from core circuit cells 602, each core circuit cell being 1 bit wide by 16 bits deep (discussed in more detail below). In the preferred embodiment, the CFI array 304 is constructed from 32 core circuit cells 602 however it will be appreciated that the core circuit cell 602 can be constructed to store more or fewer bits and that more or fewer core circuit cells 602 may be used to construct the CFI array 304. The core circuit cells 602 further include code circuit cells 604 and metal option circuit cells 606 (discussed in more detail below). Code circuit cells 604 are used to set the values of the CFI specification data which are common among the various flash memory devices that will be configured from the common design. Code circuit cells 604 are represented in FIG. 6 as 0's or 1's depending on the desired value of the data bit stored there. This cell based design simplifies implementation and changes to the CFI specification data. Metal option circuit cells 606 are used to set the values of the CFI specification data which will change among the different flash memory configurations. Metal option circuit cells 606 are designed to incorporate a second metal layer which allows changes to the circuit during the final stages of the fabrication process. The right side of FIG. 6 details the encoding of the data stored in the various bit locations of the CFI array 304 and indicates which values are configuration dependent. Locations 604, 606, 608, 610, 612, 614, 616 indicate possible locations of metal option circuit cells for configuring the CFI array 304. This procedure will be described in more detail below in conjunction with FIGS. 9A–9K.

Note that the location of the bootblocks for a bootblack configured device need not be determined at the time of manufacturing. This information is determined by other logic on the memory device 100 at the time the device 100 is used. However, the CFI array 304 must still be able to read out the location of the bootblocks for a bootblock configured device. In order to accomplish this, the CFI array 304 has an input 316 for the TBBLKB signal which indicates where the bootblocks are. This signal controls an n-channel transistor 618 which is connected between ground and the low bit 620 of the bootblack data cells 620, 622, 624. When the device is configured as a bootblack device, metal option cells, as discussed below, will be placed to short out cell 624 and open cells 622 and 620. This results in a data value of binary 011 or 0x3 hexadecimal. This is the value of a top bootblock configured device 100. If the TBBLKB signal 316 is high (indicating a bottom bootblack device), the n-channel transistor 618 will turn on, shorting cell 620 to ground and resulting in a data value of binary 010 or 0x2 hexadecimal. This is the value for a bottom bootblock configured device 100. When the device 100 is configured as a uniform device 100, the metal option cells, as discussed below, are placed to open cell 624 and short cells 622 and 620 which results in a value of binary 100 or hexadecimal 0x4 which is the value for a uniform configuration. Notice that because the metal option cell shorts out the low bit cell 620, the state of the transistor 618 is irrelevant.

Figure 7:
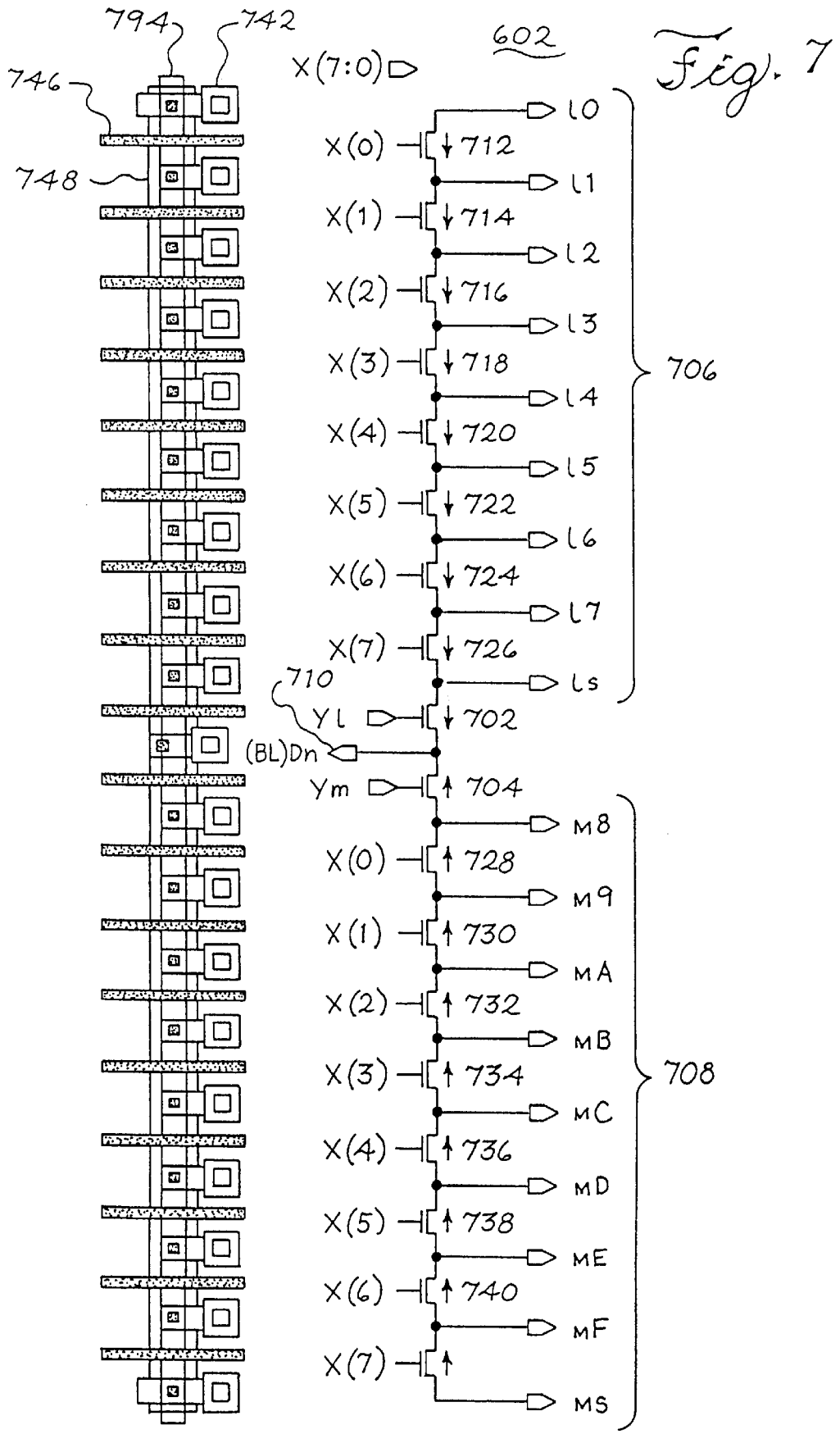
FIG. 7 depicts a schematic diagram of a core circuit cell for use in the array of FIG. 6A.

Referring to FIG. 7, there is shown a schematic diagram of a preferred core circuit cell 602 on the right hand side with the physical layer layout depicted on the left hand side. The physical layers include a first metal layer 742, a polysilicon layer 746, a second metal layer 748 and an N+ diffusion layer 744. The core circuit 602 is constructed from 18 n-channel transistors, each having a 2.3/0.5 channel width to length ratio. Transistors 702 and 704 are connected to the Y/column select address inputs and activate either transistor group 706 or 708 onto the data/bitline output 710. Transistor group 706 includes 8 transistors 712, 714, 716, 718, 720, 722, 724, 726 and transistor group 708 includes transistors 728, 730, 732, 734, 736, 738, 740. Each transistor in transistor groups 706 and 708 has an X/row select address input. The combination of a Y input and a particular X input selects that transistor cell onto the data/bitline output 710. The sources and drains of the transistors in transistor groups 706 and 708, 10-1s and m8-ms are connect to the inputs of code circuit cells 604. The code circuit cell 604 then either shorts the source to the drain or leaves the connection open for a particular transistor in transistor groups 706 and 708. This effectively sets the value of the transistor to 0 or 1.

Figure 8:
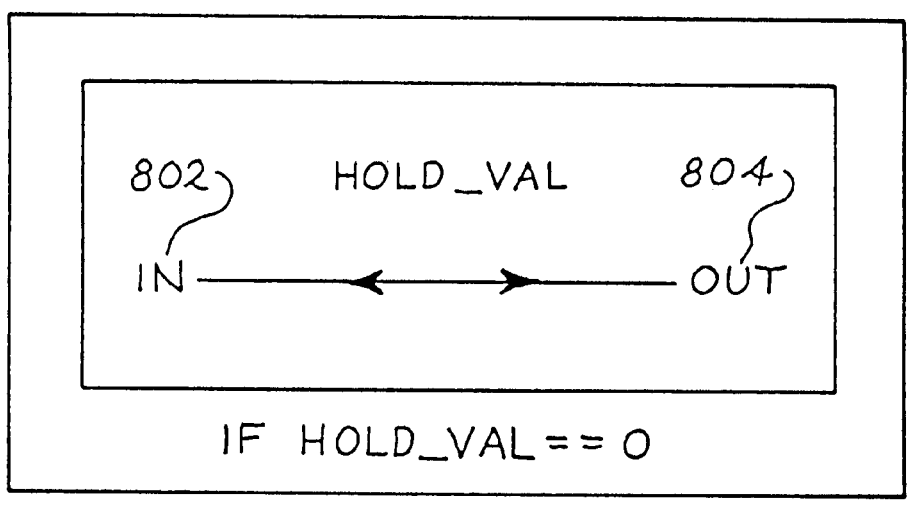
FIG. 8 depicts a schematic diagram of a code circuit cell for use in the array of FIG. 6A.

Referring to FIG. 8, there is shown a schematic diagram of a preferred code circuit cell 604. The code circuit cell 604 is designed to make implementation and alteration of the fixed data of the CFI array 304 simpler. This is accomplished by adding a hierarchical structure to the design. To alter the fixed/device-configuration-independent data in the CFI array 304, one need only change the code circuit cells 604 which are placed in the CFI array 304. If the hold_val value of the cell 604 is set to 0, the input terminal 802 of the cell 604 is shorted to the output terminal 804 of the cell 604. The code circuit cell 604 is defined by a hold value ("hold_val"), an input terminal 802 and output terminal 804. The hold value is established by the designer at the time the chip is designed. If the hold_val value of the cell 604 is set to 1, the input terminal 802 is isolated from the output terminal 804. In this way, the sources and drains of the transistors in the CFI array 304 which store the data values, can be shorted together or isolated depending on the value desired to be stored. The cell based implementation adds a layer of hierarchy to the design which allows the simpler implementation and alteration of the data during the design phase of the chip.

Referring to FIGS. 9A–9K, there are shown schematic diagrams of preferred metal option circuit cells 606. FIGS. 9A–9D depict the metal option cells 606 used to set the second bank partition size for the various configurations of devices with the sliding bank architecture. Referring back to FIG. 6, the cell 606 of FIG. 9A is placed at location 608 (labeled "s4"), the cell 606 of FIG. 9B is placed at location 610 (labeled "s3"), the cell 606 of FIG. 9C is placed at location 612 (labeled "s2") and the cell 606 of FIG. 9D is placed at locations 614 and 616 (labeled "s1"). In the preferred CFI, these cells 606 are placed as the lower 5 bits of the 8 bit value representing the second bank partition size. The upper 3 bits are fixed with code circuit cells 604 as the value 001 binary. This permits representation of values 0x20, 0x30, 0x38 and 0x3F hexadecimal which represent preferred configurations sector sizes of 32, 60, 56 or 63 sectors respectively for the second bank partition. It will be appreciated that the 8 bit field in the array permits 256 bit combinations and that any of these combinations are contemplated to represent various bank partition sizes. FIG. 9K shows a table of other sector size configurations and the representative encoded value for the preferred CFI array 304. These cells 606 incorporate circuit elements constructed at the second metal layer of the device. The bank partition sizes are encoded by making the proper metal connections at this layer for the cell 606 thereby encoding a 0 or 1 as the bit value in the CFI array 304.

FIGS. 9E and 9F depict the metal option circuit cells 606 which are placed depending on whether the device is bootblock or uniform configured. Referring to FIG. 6, the cell 606 of FIG. 9E is placed at locations indicated by UF in the CFI array 304 and the cell 606 of FIG. 9F is placed at locations indicated by BB in the CFI array 304. As discussed above, these cells incorporate the second metal layer as part of their circuit allowing the value to be changed. FIGS. 9E and 9F represent identical cells however the second metal layer of the cell 606 is changed to represent the proper value.

FIGS. 9G and 9H depict the metal option circuit cells 660 which are placed depending on whether the device operates at 2 volts or 3 volts. Referring to FIG. 6, the cell 606 of FIG. 9G is placed at locations indicated by 2 v and the cell 606 of FIG. 9H is placed at locations indicated by 3 v in the CFI array 304. As discussed above, these cells incorporate the second metal layer as part of their circuit allowing the value to be changed. FIGS. 9G and 9H represent identical cells however the second metal layer of the cell 606 is changed to represent the proper value.

FIGS. 9I and 9J depict the metal option circuit cells 660 which are placed depending on whether the main memory of the device is 8 bits wide or 16 bits wide. Referring to FIG. 6, the cell 606 of FIG. 9I is placed at locations indicated by x8 and the cell 606 of FIG. 9J is placed at locations indicated by x16 in the CFI array 304. As discussed above, these cells incorporate the second metal layer as part of their circuit allowing the value to be changed. FIGS. 9I and 9J represent identical cells however the second metal layer of the cell 606 is changed to represent the proper value.

Referring to FIGS. 10A and 10B, there is shown a table summarizing the address location and encoding of data stored in the CFI array 304 of the exemplary 32 Mb flash memory device.

This implementation is compact and uses only Metal2/Metal1 coding, which are the last layers fabricated during the manufacturing process. This allows the creation of an inventory of generic inventory of devices which can be configured in different ways as a final step in the manufacturing process. This final step can be done immediately to produce a variety of device configurations, or on an as needed basis to fulfill a specific customer request. All of the information can be readily obtained from the CFI_ARRAY. No major modification of the existing circuits is needed. The layout is small, requiring only two-thirds of the layout area as compared to other implementations. Coding changes to the configuration independent data is simplified by the modification of code circuit cell.

It is to be noted that suitable transistor sizes specifying channel width to length ratios (measured in micrometers or microns) for the transistors which make up the depicted circuits have been omitted from the figures. It will be appreciated that suitable ratios may be chosen depending on the design requirements and the capabilities and limitations of the particular integrated circuit fabrication process used for implementation of the circuit as well as the performance requirements of the specific embodiment.

It is therefore intended that the foregoing detailed description be regarded as illustrative rather than limiting, and that it be understood that it is the following claims, including all equivalents, that are intended to define the spirit and scope of this invention.

We claim:

1. An apparatus for implementing a variable common flash interface (CFI) component for a flash memory integrated circuit, said apparatus comprising:
    a storage array comprising a core array for storing first and second pieces of CFI data wherein said core array allows said first piece of CFI data to be altered by changing a single metal layer of said flash memory integrated circuit.

2. The apparatus of claim 1 further comprising:
    a decoder coupled with said storage array wherein said decoder receives and decodes an address corresponding to said second piece of CFI data and said storage array receives said decoded address and outputs said second piece of CFI data; and
    an output sense amplifier coupled with said storage array wherein said sense amplifier receives said second piece of CFI data.

3. The apparatus of claim 1, wherein said core array further comprises:
    a first bit cell comprising a code circuit operative to set a logical value of said first bit cell; and
    a second bit cell comprising a metal option circuit operative to set a logical value of said second bit cell using a single metal layer.

4. The apparatus of claim 3, wherein said single metal layer is a second metal layer of said flash memory integrated circuit.

5. The apparatus of claim 1, wherein said first piece of CFI data indicates one or more characteristics of said flash memory integrated circuit.

6. The apparatus of claim 5, wherein said characteristics include attributes selected from the group consisting of simultaneous operation capable, bank partition size, data arrangement, bootblock configuration and voltage requirements.

7. The apparatus of claim 1, wherein said flash memory integrated circuit is capable of simultaneous read and write.

8. The apparatus of claim 1, wherein said flash memory integrated circuit comprises a sliding bank architecture.

9. A common flash interface (CFI) for a flash memory chip comprising:
    a storage element that contains CFI data;
    an alteration layer that allows said CFI data to be changed by changing only a metal layer of said flash memory chip.

10. The common flash interface of claim 9, wherein said metal layer is a second metal layer.

11. An apparatus for implementing a variable common flash interface ("CFI") component, said apparatus comprising:
   a storage array for storing one or more CFI data, said storage array including a core array that stores said one or more CFI data and further allows a first of said one or more CFI data to be altered by changing a single metal layer.

12. The apparatus of claim 11 further comprising:
   a decoder coupled with said storage array wherein said decoder receives and decodes an address corresponding to a second of said one or more CFI data and further wherein said storage array receives said decoded address and outputs said second one or more CFI data; and
   an output sense amplifier coupled with said storage array and operative to receive and sense said stored CFI data.

13. The apparatus of claim 11, wherein said core array further comprises:
   a plurality of bit cells, where:
      at least one of said plurality of bit cells comprises a code circuit operative to set the logical value of said bit cell; and
      at least another of said plurality of bit cells comprises a metal option circuit operative to set the logical value of said bit cell using a single metal layer.

14. The apparatus of claim 13, wherein said single metal layer is a second metal layer.

15. The apparatus of claim 11, wherein said first one or more CFI data indicates characteristics of a flash memory integrated circuit.

16. The apparatus of claim 15, wherein said characteristics include attributes selected from the group consisting of, simultaneous operation capability, bank partition size, data arrangement, bootblock configuration and voltage requirements.

17. The apparatus of claim 15, wherein said flash memory integrated circuit is capable of simultaneous read and write.

18. The apparatus of claim 15, wherein said flash memory integrated circuit comprises a sliding bank architecture.

19. A common flash interface ("CFI") comprising:
   means for storing CFI data;
   means for altering said CFI data by changing only a single metal.

20. The common flash interface of claim 19, wherein said metal layer is a second metal layer.

* * * * *

UNITED STATES PATENT AND TRADEMARK OFFICE
CERTIFICATE OF CORRECTION

PATENT NO.   : 6,163,478
DATED        : December 19, 2000
INVENTOR(S)  : Yashushi Kasa and Fan W. Lai Page 1 of 1

It is certified that error appears in the above-identified patent and that said Letters Patent is hereby corrected as shown below:

Column 20,
Line 20, should read -- means for altering said CFI data by changing only a single metal layer. --

Signed and Sealed this

Thirtieth Day of April, 2002

Attest:

Attesting Officer

JAMES E. ROGAN
Director of the United States Patent and Trademark Office